United States Patent [19]

Bukowski et al.

[11] Patent Number: 4,837,459

[45] Date of Patent: Jun. 6, 1989

[54] CMOS REFERENCE VOLTAGE GENERATION

[75] Inventors: Eugene R. Bukowski, Cary; Charles R. Hoffman, Raleigh, both of N.C.

[73] Assignee: International Business Machines Corp., Armonk, N.Y.

[21] Appl. No.: 72,362

[22] Filed: Jul. 13, 1987

[51] Int. Cl.[4] .................. H03K 3/023; H03K 3/353; H03K 3/013; H03K 17/687

[52] U.S. Cl. .................. 307/296.8; 307/355; 307/494; 307/497; 307/260; 323/315; 330/253; 330/261

[58] Field of Search .................. 307/296 R, 297, 497, 307/494, 355, 260, 350, 304; 323/315, 316; 330/253, 261

[56] References Cited

U.S. PATENT DOCUMENTS

| | | | |
|---|---|---|---|
| 3,975,648 | 8/1976 | Tobey, Jr. et al. | 307/296 R X |
| 4,100,437 | 7/1978 | Hoff, Jr. | 307/304 X |
| 4,301,421 | 11/1981 | Yokoyama | 330/253 |
| 4,305,011 | 12/1981 | Audaire et al. | 307/304 X |
| 4,327,320 | 4/1982 | Oguey et al. | 307/304 X |
| 4,333,058 | 6/1982 | Hoover | 330/253 |
| 4,341,963 | 7/1982 | Jensen et al. | 307/497 |
| 4,427,903 | 1/1984 | Sugimoto | 307/355 |
| 4,442,398 | 4/1984 | Bertails et al. | 307/297 X |
| 4,453,094 | 6/1984 | Peil et al. | 307/501 X |
| 4,464,588 | 8/1984 | Wieser | 307/304 X |
| 4,472,871 | 9/1984 | Green et al. | 357/23.12 X |

*Primary Examiner*—Stanley D. Miller
*Assistant Examiner*—David R. Bertelson
*Attorney, Agent, or Firm*—Joscelyn G. Cockburn

[57] ABSTRACT

A process insensitive reference voltage generator includes a first and second identical FET devices coupled in a parallel configuration with a first biasing network, of FET devices, interconnecting the substrate terminal of the first FET device to a first node formed between a positive voltage supply and ground potential. The control terminal is connected to a second node whose voltage potential is different from that of the first node. The substrate terminal of the second FET device is connected to the source terminal. The source terminals of both FET devices are connected to the respective input terminals of an operational amplifier whose output is connected to the control terminal of said second FET device.

11 Claims, 2 Drawing Sheets

CMOS REFERENCE VOLTAGE GENERATION

CROSS REFERENCE TO RELATED PATENT APPLICATIONS

The present application relates to application Ser. No. 023189, entitled "CMOS Precision Voltage Reference Generator," filed Mar. 6, 1987, by Charles R. Hoffman, and assigned to the assignee of the present application. The referenced application uses threshold implants to provide a reference voltage. The present invention provides a reference voltage by tying the substrate terminals of identical FET devices to different voltage potentials.

BACKGROUND OF THE INVENTION

1. Field of the Invention

This invention relates to integrated circuit technology in general, and more particularly, to circuits that generate reference voltage in said technology.

2. Prior Art

Rapid improvements in the development of integrated circuit technology have made it possible to combine analog and digital circuits on the same chip. In the past, separate integrated circuit modules were used to package analog and digital circuits, respectively. With separate packaging, one would select a process that optimizes the fabrication of a particular circuit type. However, by combining the two types of circuits on a single chip, it is desirable to select a process that at least optimizes the fabrication of the circuits that dominate the chip.

In addition, each type of circuit usually requires unique functions that may not be needed by the other type of circuit. Thus, it is desirable to use a process that optimizes the implementation of these functions.

It has been determined that a "digital CMOS process" is effective in implementing mixed circuit (i.e., digital and analog) integrated chips. Usually, the analog circuits in CMOS are a small part of a predominantly digital circuit chip. Thus, the "digital CMOS process" optimizes the implementation of devices that are needed to implement the digital portion of the chip. Devices that are needed to implement analog functions are not available. Thus, a circuit designer is faced with the awesome task of using digitally friendly devices to implement analog functions. Among the many analog functions which a designer must provide is a stable reference voltage.

The generation of a reference voltage using CMOS technology has been done in the past. Known prior art implementation uses two FETs with different threshold voltages. The differential voltage resulting from the different thresholds is the reference voltage. The prior art also teaches that the device threshold voltages can be controlled by ion implantation and different device geometrics. Examples of the prior art teachings are set forth in U.S. Pat. Nos. 4,442,398; 4,305,011; 4,464,588; 4,100,437; 4,327,320; 4,472,871 and 4,453,094.

Other publications addressing CMOS reference voltage generators are:

1. Gray, P.R. and Meyer, R.G., "Analysis and Design of Analog Integrated Circuits," 2nd edition, Wiley, New York, 1983, Chapter 12.

2. Blauschild, R.A., et al, "A New NMOS Temperature-Stable Voltage Reference," IEEE JSSC, December 1978, pp. 767–773.

3. Song, B.S. and Gray, P.R., "A Precision Curvature-Connected CMOS Bandgap Reference," Digest of Papers, 1983, ISSCC.

4. Liu, S., and Nagel, L.W., "Small-Signal MOSFET Models for Analog Circuit Design," IEEE JSSC, December 1982, pp. 983–998.

5. Gregorian, R. et al, "Switched-Capacitor Circuit Design," IEEE Proceedings, August 1983, pp. 941–966.

A common problem faced by these designs is that there is a wide variation in the range of threshold voltages. It is believed that the wide variation in theshold voltages is caused by variation in the process used to fabricate the chip. Another common problem is that non-CMOS structures such as bipolar structures are fabricated in the LSI chip. This requires additional process steps which increase the cost of the chip.

BRIEF SUMMARY OF THE INVENTION

It is therefore the primary object of the present invention to provide a CMOS circuit arrangement which establishes an accurate reference voltage that is independent of temperature and process variations.

The circuit arrangement includes a pair of identical P-channel FET devices. The source and drain terminals of both devices are supplied with equal current generated from a single rail power supply. The source terminal of each device is connected to separate inputs of an operational amplifier whose output is connected to a control terminal of one of the devices. The substrate or bulk terminal of said one device is connected to its source terminal. The control terminal of the other device is connected to an a.c. ground reference voltage ($V_{ACG}$) while a precise biasing voltage ($V_{BS}$) is connected to the bulk and source terminals. The biasing scheme causes a voltage difference ($\Delta V_t$) between the threshold voltages of the devices. The voltage difference ($\Delta V_t$) is algebraically summed with $V_{ACG}$ to provide a reference voltage free from the effects of process and temperature variation.

In an alternate embodiment of the invention the drain electrodes of the FET devices are connected to different inputs of the operational amplifiers whose output is connected to the control terminal of one of the FET devices. $V_{(BS)}$ is generated and applied to the bulk and source terminals of the one FET device.

The foregoing features and advantages of this invention will be more fully described in the accompanying drawings.

DESCRIPTION OF THE PREFERRED EMBODIMENT

The improved reference voltage generator to be described hereinafter is formed with four terminal FET devices using a regular CMOS fabricating process. Depending on the technique used, the FET devices may be P-channel enhancement mode devices and/or N-channel enhancement mode devices. In the interests of brevity, the description is limited to the use of P-channel enhancement devices only, it being understood that it is well within the skill of one skilled in the art to use N-channel devices to fabricate the improved voltage reference generator. The P-channel enhancement mode FET devices are shown in the figures as rectangular blocks with diagonals. Likewise, the substrate terminals are shown as horizontal lines with arrows pointing away from the rectangular blocks.

Figure 1:
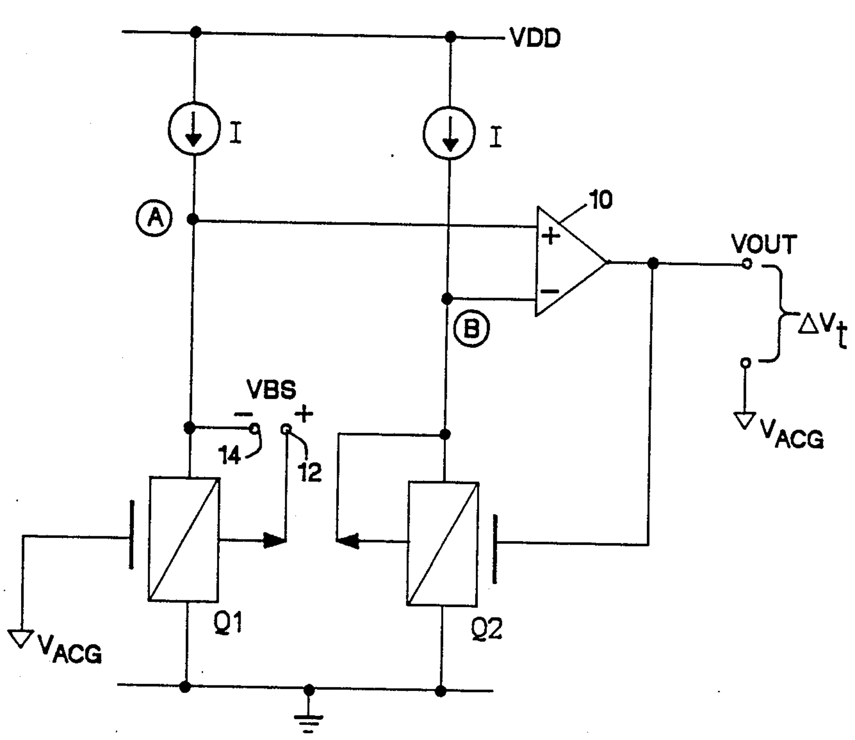
FIG. 1 shows a circuit schematic of the CMOS reference voltage generator according to the teachings of the present invention.

Referring now to the drawings, and FIG. 1 in particular, the improved reference voltage generator includes a pair of reference voltage generating FE devices Q1 and Q2. In the preferred embodiment of this invention FET devices Q1 and Q2 are identical P-channel enhancement mode FET devices. The drain electrodes of FET devices Q1 and Q2 are tied to a common node which is connected to ground potential (GND). An operational amplifier 10 has its positive input terminal connected to the source terminal of FET Q1 at node A. Similarly, the negative terminal of operational amplifier 10 is connected to the source electrode of FET device Q2 at node B. The output terminal of operational amplifier 10 is connected to the gate or control electrode of FET device Q2. The substrate terminal of FET device Q2 is connected to its source terminal. A common current source I interconnects the source terminals of FET devices Q1 and Q2 to a single rail power supply ($V_{dd}$).

Still referring to FIG. 1, the substrate terminal and source terminal of Q1 are connected to a controlled voltage $V_{BS}$. $V_{BS}$ is the bulk to source voltage formed by the difference between the voltage applied to node 12 and node 14, respectively. In the preferred embodiment of this invention, the voltage at node 12 is positive relative to the voltage on node 14. Stated another way, $V_{sub} \geqq V$source, similarly, the gate or control terminal of Q1 is connected to a control voltage identified as $V_{ACG}$. Preferably, $V_{ACG}$ and $V_{BS}$ are set by P-channel FET devices with values between $V_{dd}$ and ground. The function of operational apmplifier is to keep the voltage at node B equal to the voltage at node A through negative feedback. With similar voltage at nodes A and B, the output of the operational amplifier is the difference between the threshold voltage of Q1 and Q2 having the same polarity and of the same channel implants but having different $V_{BS}$ voltages and thus having different threshold voltages. As will be shown subsequently, this voltage difference ($\Delta V_t$) is determined by the given process. However, it is insensitive to process variation.

Even though a plurality of different circuit configurations can be used to generate $V_{BS}$, $V_{ACG}$ and constant current (I) for biasing FET devices Q1 and Q2, in the preferred embodiment of this invention only components which can be fabricated from regular CMOS processes are used. Similar to Q1 and Q2, these circuit components are four terminal P-channel enhancement mode devices.

Figure 2:
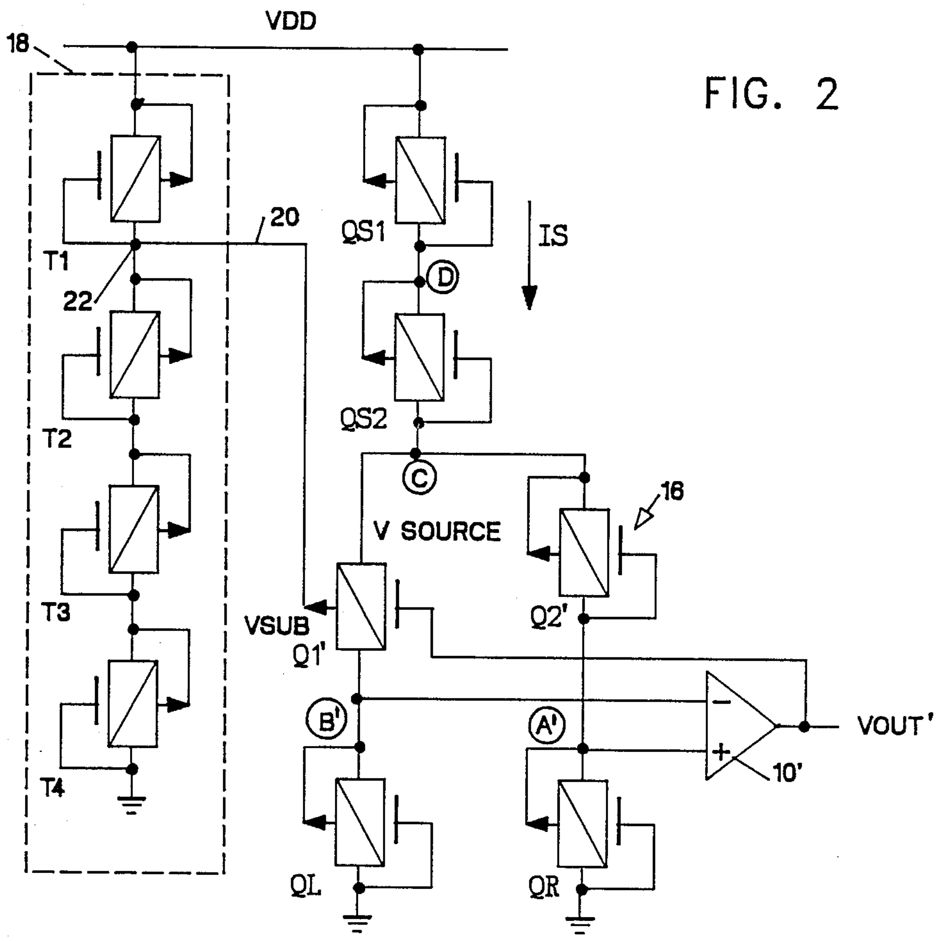
FIG. 2 shows a more detailed implementation.

Turning now to FIG. 2, Q1' and Q2' are the reference voltage setting devices. These devices are similar to Q1 and Q2 of FIG. 1. The source electrodes $V_{source}$ of devices Q1' and Q2' are connected to node C. Node C is connected by devices QS2 and QS1 to single rail power supply $V_{dd}$. Devices QS1 and QS2 are connected in series by their respective drain source terminal at node D. Similarly, each of the devices QS1 and QS2 has its substrate electrode connected to its source electrode and the control gate electrode connected to the drain electrode. It should be noted that by connecting the source and substrate terminal of a device the threshold voltage for that device is substantially the base threshold voltage ($V_{to}$). It can be shown that when the width to length (W/L) ratio of QS1 and QS2 and the equivalent width to length $(t)_{eq}$ ratios of Q1 and Q2, and QL and QR respectively are all identical the voltage at node C is $V_{dd}/2$.

Still referring to FIG. 2, P-channel enhancement mode FET device QL is connected between ground potential and the drain terminal of device Q1'. Similarly, P-channel enhancement mode FET device QR is connected between ground potential and the drain terminal of device Q2'. Each of the devices QL and QR has its control electrode connected to its drain electrode and its substrate electrode connected to its source electrode. The configuration ensures that the same current is conducted through Q1' and Q2'.

Operational amplifier 10' has its output $V'_{out}$ connected to the control electrode of device Q1'. The negative input of operational amplifier 10' is connected at node B' to the drain terminal of device Q1'. Similarly, the positive terminal of operational amplifier 10' is connected at node A' to the drain terminal of device Q2'. Since the output of the operational amplifier is connected in a negative feedback to its input, the voltages at terminals A' and B' are kept at the same potentials ($V_{dd}/4$) and the output $V_{out}=(V_{dd}/4-\Delta V_t)$. As was previously shown, $\Delta V_t$ equals the difference between threshold voltages Q1' and Q2'. By making the width to length ratio (W/L) of device QS1 or QS2 equal to twice the (W/L) ratio of device QR or QL and device Q1' or Q2' the current through voltage threshold setting devices Q1' and Q2' are identical and the voltage on control terminal 16 is $V_{dd}/4$.

Still referring to FIG. 2, the voltage on the substrate terminal ($V_{sub}$) of device Q1' is set by biasing network 18. Conductor 20 interconnects the biasing network (at node 22) to $V_{sub}$. Biasing network 18 comprises of a plurality of P-channel enhancement mode devices T1, T2, T3 and T4. The devices are connected in series via their respective source and drain electrodes between $V_{dd}$ and ground potential. Also, the substrate terminal of each device is connected to its source terminal and the control terminal is connected to the drain terminal. If the width/length (W/L) ratios of T1, T2, T3 and T4 are equal, then the value of the voltage at node 22 is $\simeq V_{dd}/4$.

In order for the reference voltage to be independent of process and/or temperature variation, the following geometrical characteristics must be observed in fabricating the FET devices. In each of the following expressions W represents the width of the device, L represents the length of the device, W/L represents the width to length ratio and the alphanumeric characters identify the particular device.

(1) $(W/L)T1=(W/L)T2=(W/L)T3=(W/L)T4$ (2) $(W/L)Q1'=(W/L)Q2'=(W/L)QL=(W/L)QR$ (3) $(W/L)QS1=(W/L)QS2$ (4) $(W/L)QS1=2\ (W/L)QR$

When the P-channel enhancement mode devices of FIG. 2 are designed according to the above geometrical ratios, then $V'_{out}$ equals ($V_{dd}/4-\Delta V_t$).

It should be noted that a designer can generate (with appropriate biasing network) any values he desires at node C and node 22. However, in order for $V'_{out}$ (that is, the reference voltage) to be independent of temperature and/or process variation, only biasing networks that produce voltage level values that are certain percentages of $V_{dd}$, at node C and node 22, are permissible. Thus, the biasing networks must be chosen to provide these values. The below Table I lists examples of these values. In the table, $\alpha$ represents the fraction of $V_{dd}$ which appears in the output voltage ($V_{out}$) as the. a.c. ground reference (i.e., $0 \leqq \partial \leqq 1$).

$V_{dd}$ represents the supply voltage.

$V_{source}$ represents the percentage of $V_{dd}$ that must be generaed at node C. $V_{sub}$ represents the percentage of $V_{dd}$ that must be generated at node 22. $V_{BS}$ is the percentage of $V_{dd}$ representing the controlled voltage difference between node 22 and node C (i.e., $V_{BS}=V_{sub}-V_{source}$). $\Delta V_t$ represents the difference in threshold voltages between Q1' and Q2'. And $V_{out}$ is the output voltage. It should be noted that this table is only a representative of preferred values which must be generated at the critical nodes of the circuit in FIG. 2. However, it is within the skill of the art to provide any desired voltage without departing from the spirit and scope of the present invention.

TABLE I

| $\alpha'$ | $V_{source}$(V) | $V_{sub}$(V) | $V_{BS}$(V) | $V_{out}$(V) |
|---|---|---|---|---|
| $\frac{1}{4}$ | $\frac{Vdd}{2}$ | $\frac{2Vdd}{3}$ | $\frac{Vdd}{6}$ | $\left(\frac{Vdd}{4} \pm \Delta V_t\right)$ |
| $\frac{1}{4}$ | $\frac{Vdd}{2}$ | $\frac{3Vdd}{4}$ | $\frac{Vdd}{4}$ | $\left(\frac{Vdd}{4} \pm \Delta V_t\right)$ |
| $\frac{1}{4}$ | $\frac{Vdd}{2}$ | Vdd | $\frac{Vdd}{2}$ | $\left(\frac{Vdd}{4} \pm \Delta V_t\right)$ |
| $\frac{1}{3}$ | $\frac{2Vdd}{3}$ | $\frac{3Vdd}{4}$ | $\frac{Vdd}{12}$ | $\left(\frac{Vdd}{3} \pm \Delta V_t\right)$ |
| $\frac{1}{3}$ | $\frac{2Vdd}{3}$ | Vdd | $\frac{Vdd}{3}$ | $\left(\frac{Vdd}{3} \pm \Delta V_t\right)$ |
| $\frac{1}{2}$ | $\frac{3Vdd}{4}$ | Vdd | $\frac{Vdd}{4}$ | $\left(\frac{Vdd}{2} \pm \Delta V_t\right)$ |

While the invention has been, shown and described with reference to a preferred embodiment thereof, it will be understood by those skilled in the art that various changes in form and details may be made within without departing from the spirit and scope of the invention.

Having thus described our invention, what we claim and desire to secure as Letters Patent is as follows:

1. A circuit arrangement for generating a reference voltage comprising:

first FET device and second FET device, with each device having a control terminal, a drain terminal, a source terminal and a substrate terminal and both devices having the same base threshold voltage;

an operational amplifier having a positive input terminal connected to the source terminal of the first FET device, a negative input terminal connected to the source terminal of the second FET device and an output terminal;

a first means interconnecting the output terminal to the control terminal of the second FET device;

a second means interconnecting the substrate terminal to the source terminal of said second FET device;

a first biasing network for generating a first reference voltage connected to the control terminal of the first FET device;

a second biasing network for generating a second reference voltage connected to the source and substrate terminals of the first FET device; and third means for generating identical current flow connected to the source electrodes of the first FET device and the second FET device.

2. The circuit arrangement of claim 1 further including a single rail power supply coupled to the third means.

3. The circuit arrangement of claim 1 wherein the first and second means include electrical conductors.

4. The circuit arrangement of claim 2 wherein the third means includes third and fourth FET devices connected in series between the single rail power supply and the source terminals of the first FET device and second FET device and fifth and sixth FET devices being configured in parallel relative to the series connected third and fourth FET devices and interconnecting the drain electrodes of the first and second FET devices to a ground potential.

5. The circuit arrangement of claim 4 wherein the FET devices include P-channel enhancement type.

6. The circuit arrangement of claim 4 wherein the W/L ratios of the third and fourth devices are the same.

7. The circuit arrangement of claim 4 wherein the W/L ratio of the third or the fourth FET device is twice the W/L ratio of the fifth or sixth FET device.

8. The circuit arrangement of claim 4 wherein the W/L ratio of the FET devices are the same.

9. The circuit arrangement of claim 1 wherein the second biasing network includes a plurality of FET devices connected in series between a single rail power supply and a ground potential.

10. The circuit arrangement of claim 9 wherein the FET devices include P-channel enhancement mode devices with each device having its substrate terminal connected to its source terminal and its gate terminal connected to its drain terminal.

11. An improved CMOS circuit arrangement for generating a process independent reference voltage from a single rail power supply comprising:

a first FET and a second FET device, each drive having a control terminal, a substrate terminal, a source terminal and a drain terminal and both devices having the same base threshold;

an operational amplifier having an output terminal connected to the control terminal of the first FET, a negative input terminal connected to the drain terminal of said first FET device and a positive input terminal connected to the drain electrode of the second FET device;

a first pair of current setting FET devices, each one being connected between the drain terminal and ground potential of respective first and second FET devices;

a second pair of voltage setting FET devices connected in series between the source terminals of the first and second FET devices and the single rail power supply;

a plurality of FET devices connected in series between the ground potential and the single rail power supply; and means for interconnecting the substrate terminal of the first FET device to a selected node form between the plurality of FET devices.

* * * * *